(12) United States Patent
Fukasawa et al.

(10) Patent No.: US 7,837,800 B2
(45) Date of Patent: *Nov. 23, 2010

(54) CMP POLISHING SLURRY AND POLISHING METHOD

(75) Inventors: Masato Fukasawa, Hitachi (JP); Masato Yoshida, Tsukuba (JP); Naoyuki Koyama, Hitachi (JP); Yuto Ootsuki, Hitachi (JP); Chiaki Yamagishi, Hitachi (JP); Kazuhiro Enomoto, Mito (JP); Kouji Haga, Hitachi (JP); Yasushi Kurata, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/149,216

(22) Filed: Apr. 29, 2008

(65) Prior Publication Data

US 2008/0214093 A1    Sep. 4, 2008

Related U.S. Application Data

(62) Division of application No. 10/544,073, filed as application No. PCT/JP2004/000916 on Jan. 30, 2004.

(30) Foreign Application Priority Data

Jan. 31, 2003  (JP)  .......................... P2003-024105

(51) Int. Cl.
    *B08B 3/08*    (2006.01)
    *C11D 7/02*    (2006.01)
    *C11D 7/26*    (2006.01)
    *C11D 7/32*    (2006.01)

(52) U.S. Cl. .................. 134/1.3; 510/175; 510/475; 510/499; 510/501; 510/505; 438/692

(58) Field of Classification Search .......... 510/175, 510/475, 501, 505, 508; 438/692
    See application file for complete search history.

(56) References Cited

U.S. PATENT DOCUMENTS

| 6,348,076 | B1 | 2/2002 | Canaperi et al. |
| 6,375,545 | B1 * | 4/2002 | Yano et al. ............ 451/36 |
| 6,440,856 | B1 | 8/2002 | Bessho et al. |
| 6,454,819 | B1 | 9/2002 | Yano et al. |
| 2002/0077035 | A1 * | 6/2002 | Wang et al. .......... 451/41 |
| 2004/0010978 | A1 | 1/2004 | Uchino et al. |

FOREIGN PATENT DOCUMENTS

| JP | 10-231473 A | 9/1998 |
| JP | 2000-323444 | 11/2000 |
| JP | 2001-064631 A | 3/2001 |
| JP | 2001-064681 A | 3/2001 |
| JP | 2001-064685 A | 3/2001 |
| JP | 2001-064688 A | 3/2001 |
| JP | 2001-107089 A | 4/2001 |
| JP | 2001226666 A | 8/2001 |
| JP | 2001311073 A | 11/2001 |
| JP | 2002-353175 | 12/2002 |
| JP | 2003-17446 | 1/2003 |

OTHER PUBLICATIONS

Torajiro Honma et al.; "Effect of Various Factors on Grinding Using Jet Mill", Dept. of Chem. Eng., Yamagata Univ., vol. 6, No. 5, (1980), pp. 527-532. (Cited in the specification), (May 1980).
Taiwanese Office Action dated Aug. 30, 2006 (mailing date), issued in corresponding Taiwanese Patent Application No. 09520702800.
Japanese Office Action dated Aug. 5, 2008 (mailing date), issued in corresponding Japanese Patent Application No. 2005-504769.
Japanese Office Action dated Jun. 9, 2009 (dispatch date), issued in corresponding Japanese Patent Application No. 2005-504769.

* cited by examiner

*Primary Examiner*—Gregory R Del Cotto
(74) *Attorney, Agent, or Firm*—Westerman, Hattori, Daniels & Adrian, LLP

(57) ABSTRACT

The present invention relates to a CMP polishing slurry, comprising cerium oxide particles, a dispersing agent, a water-soluble polymer and water, wherein the water-soluble polymer is a compound having a skeleton of any one of an N-mono-substituted product and an N,N-di-substituted product of any one selected from the group consisting of acrylamide, methacrylamide and α-substituted products thereof. The amount of the water-soluble polymer is preferably in the range of 0.01 part or more by weight and 10 parts or less by weight for 100 parts by weight of the polishing slurry. Thus it is possible to provide a polishing slurry and a polishing method which make it possible to polish a film made of silicon oxide or the like effectively and rapidly and further control the process therefor easily in CMP technique for flattening an interlayer insulating film, a BPSG film, an insulator film for shallow trench isolation, and other films.

8 Claims, No Drawings

CMP POLISHING SLURRY AND POLISHING METHOD

CROSS-REFERENCE TO RELATED APPLICATION

This application is a Divisional of application Ser. No. 10/544,073, filed on Jul. 29, 2005, which is a National Stage of International Application No. PCT/JP2004/000916, filed on Jan. 30, 2004, the entire contents of which are hereby incorporated by reference.

TECHNICAL FIELD

The present invention relates to a CMP polishing slurry for semiconductor insulating films which is used in the step of flattening a substrate surface, in particular, the step of flattening an interlayer insulating film or a BPSG (boron and phosphorus doped silicon dioxide) film, the step of producing shallow trench isolation, and other steps, which are associated with semiconductor element producing technique; and a method for polishing a substrate by use of the CMP polishing slurry.

BACKGROUND ART

Current ultra large scale integrated circuits have a tendency that the packing density thereof is increased, and various fine processing techniques are being researched and developed. The existing design rule is a rule in the order of sub-half-micron. One technique developed to satisfy such a severe desired for the shrinkage of the size is CMP (chemical mechanical polishing) technique. In the process for producing semiconductor devices, this technique makes it possible to flatten completely layers to be exposed to light, decrease a burden on exposure technique, and make the yield stable; therefore, the technique becomes essential at the time of flattening an interlayer insulating film or a BPSG film, performing shallow trench isolation, and attaining others.

Hitherto, a fumed silica based polishing slurry has been generally investigated as a CMP polishing slurry for flattening an inorganic insulator film, such as a silicon oxide insulator film, which is formed by plasma CVD (chemical vapor deposition), low-pressure CVD or some other method. The fumed silica based polishing slurry is produced by growing silica-grains in a manner of the thermal decomposition of silicon tetrachloride or in some other manner, and then adjusting the pH thereof. However, such a polishing slurry does not have a sufficient polishing rate for polishing inorganic insulator films, and thus has a technical problem of a low polishing rate against the practical use thereof.

About conventional techniques for flattening an interlayer insulating film, the polishing rate has dependency on the pattern of a film to be polished on a substrate. Thus, in accordance with the difference in the density of the pattern or the difference in the size thereof, the rate of polishing convex regions therein is largely varied and further the polishing of concave regions therein also advances unfavorably. Consequently, there remains a technique problem that the whole of a surface of a wafer cannot be flattened at a high level.

In the CMP technique for flattening an interlayer insulating film, it is necessary to end the polishing in the middle of the interlayer insulating film, and a process-controlling method of controlling the polish amount dependently on polishing time is generally performed. However, the polishing rate is remarkably changed by a change in the shape of steps in a pattern, the condition of a polishing cloth, and others. Accordingly, the technique has a problem that the process thereof is not easily controlled.

In the generation of a 0.5-μm or more design rule, LOCOS (local oxidation of silicon) was used to isolate elements in integrated circuits. When the dimension for working is made finer thereafter, a technique for making the isolation width of elements narrow is required. Thus, shallow trench isolation is being used. In the shallow trench isolation, CMP is used to remove an excess of a silicon oxide film formed on a substrate, and a stopper film, about which the rate that this film is polished is slow, is formed beneath the silicon oxide film in order to stop the polishing. In the stopper film, silicon nitride or the like is used, and it is desired that the ratio between the rate that the silicon nitride film is polished and the rate that the stopper film is polished is large.

Meanwhile, a cerium oxide polishing slurry is used as a glass surface polishing slurry for photo-masks, lenses and others. Cerium oxide particles have a lower hardness than silica particles or alumina particles. Accordingly, polished surfaces are not easily scratched. For this reason, the polishing slurry is useful for mirror-finish polishing. Attention is paid to this matter to suggest a cerium oxide polishing slurry (Japanese Patent Application Laid-Open No. 2002-353175). However, this cerium oxide polishing slurry has a problem that flattening performance, which has been severely desired in recent years, is not always sufficient.

In light of the above-mentioned problems, the present invention provides a polishing slurry and polishing method which are capable of polishing a silicon oxide film effectively and rapidly and which also make the process-control of the polishing easy in CPM technique for flattening an interlayer insulating film, a BPSG film and an insulator film for shallow trench isolation.

DISCLOSURE OF THE INVENTION

The CMP polishing slurry of the present invention relates to (1) a CMP polishing slurry, comprising cerium oxide particles, a dispersing agent, a water-soluble polymer and water, wherein the water-soluble polymer is a compound having a skeleton of any one of an N-mono-substituted product and an N,N-di-substituted product of any one selected from the group consisting of acrylamide, methacrylamide and α-substituted products thereof.

(2) The CMP polishing slurry of the invention relates to the CMP polishing slurry according to the above-mentioned (1), wherein the water-soluble polymer is a polymer containing a recurring unit made of at least one polymerizable monomer selected from the group consisting of the following general formula (I):

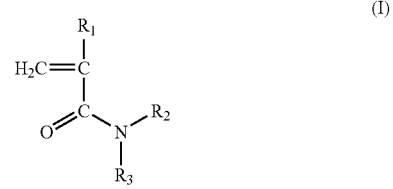

wherein $R_1$ represents a hydrogen atom, a methyl group, a phenyl group, a benzyl group, a chloro group, a difluoromethyl group, a trifluoromethyl group, or a cyano group; and $R_2$ and $R_3$ each independently represent a hydrogen atom, an alkyl chain of $C_1$ to $C_{18}$, a methylol group, or an acetyl group provided that the case that both of $R_2$ and $R_3$ are hydrogen atoms is excluded; and the following general formula (II):

(II)

wherein $R_1$ is identical with $R_1$ in the formula (I), that is, $R_1$ represents a hydrogen atom, a methyl group, a phenyl group, a benzyl group, a chloro group, a difluoromethyl group, a trifluoromethyl group, or a cyano group; and $R_4$ represents a morpholino group, a thiomorpholino group, a pyrrolidino group, or a piperidino group.

(3) The CMP polishing slurry of the invention relates to the CMP polishing slurry according to the above-mentioned (1) or (2), wherein the added amount of the water-soluble polymer is 0.01 part or more by weight and 10 parts or less by weight for 100 parts by weight of the polishing slurry.

Furthermore, the substrate-polishing method of the present invention is (4) a polishing method for polishing a film to be polished, wherein a substrate on which the film is formed is pushed against a polishing cloth of a polishing table, pressure is applied to the substrate, and then the film to be polished on the substrate and the polishing cloth are relatively moved while the CMP polishing slurry according to any one of the above-mentioned (1) to (3) is supplied between the film and the polishing cloth.

BEST MODES FOR CARRYING OUT THE INVENTION

In general, cerium oxide can be obtained by oxidizing a cerium compound of a carbonate, nitrate, sulfate or oxalate. The cerium oxide polishing slurry used to polish a silicon oxide film formed by TEOS-CVD or the like tend to make higher-speed polishing possible but undergo scratches more easily as the primary particle size thereof is larger and the crystal strain thereof is smaller, that is, the crystallinity thereof is better. Thus, the crystallite diameter of the cerium oxide is preferably 5 nm or more and 300 nm or less although the process for producing the cerium oxide particles used in the present invention is not limited. The content by percentage of alkali metals and halogens in the cerium oxide particles is preferably controlled into 10 ppm or less since the polishing slurry of the invention is used to polish substrates associated with the production of semiconductors.

In the present invention, firing or oxidization with hydrogen peroxide or the like can be used as a method for producing cerium oxide powder. The temperature for the firing is preferably 350° C. or higher and 900° C. or lower.

Since the cerium oxide particles produced by the above-mentioned process aggregate, it is preferred to pulverize the particles mechanically. The method for the pulverization is preferably a dry pulverizing method using a jet mill or the like, or a wet pulverizing method using a planetary bead mill or the like. The jet mill is described in, for example, Chemical Engineering Paper Collection (Kagaku Kougaku Ronbunsyu) vol. 6, No. 5 (1980), 527-532.

The CMP polishing slurry in the present invention is obtained, for example, by dispersing a composition composed of cerium oxide particles having the above-mentioned characteristics, a dispersing agent and water and further adding thereto a water-soluble polymer and additives, which will be described later. The order of the addition of the respective components is not limited.

The concentration of the cerium oxide particles in the CMP polishing slurry is not limited, and is preferably within the range of 0.5% by weight or more to 20% by weight or less since the dispersion (slurry) is easily handled.

Since the dispersing agent is used to polish substrates associated with the production of semiconductors, the content of alkali metals such as sodium and potassium ions, halogens and sulfur therein is preferably controlled into 10 ppm or less. Preferable is, for example, a polymeric dispersing agent containing an ammonium salt of acrylic acid as a polymerizable monomer component. It is allowable to use two or more dispersing agents including: a polymeric dispersing agent which contains an ammonium salt of acrylic acid as a polymerizable monomer component; and at least one selected from water-soluble anionic dispersing agents, water-soluble nonionic dispersing agents, water-soluble cationic dispersing agents, and water-soluble amphoteric dispersing agents.

Examples of the water-soluble anionic dispersing agents include triethanolamine laurylsulfate, ammonium laurylsulfate, triethanolamine polyoxyethylenealkylethersulfate, and especial polycarboxylic acid type polymeric dispersing agents. Examples of the water-soluble nonionic dispersing agents include polyoxyethylene lauryl ether, polyoxyethylene cetyl ether, polyoxyethylene stearyl ether, polyoxyethylene oleyl ether, polyoxyethylene higher-alcohol ether, polyoxyethylene octyl phenyl ether, polyoxyethylene nonyl phenyl ether, polyoxyalkylene alkyl ether, polyoxyethylene derivatives, polyoxyethylene sorbitan monolaurate, polyoxyethylene sorbitan monopalmitate, polyoxyethylene sorbitan monostearate, polyoxyethylene sorbitan tristearate, polyoxyethylene sorbitan monooleate, polyoxyethylene sorbitan trioleate, polyethylene sorbitol tetraoleate, polyethylene glycol monolaurate, polyethylene glycol monostearate, polyethylene glycol distearate, polyethylene glycol monooleate, polyoxyethylene alkylamine, polyoxyethylene hardened castor oil, and alkylalkanolamide. Examples of the water-soluble cationic dispersing agents include polyvinyl pyrrolidone, coconut amine acetate, and stearylamine acetate. Examples of the water-soluble amphoteric dispersing agents include laurylbetaine, stearylbetaine, lauryldimethylamine oxide, and 2-alkyl-N-carboxymethyl-N-hydroxyethylimidazolinium betaine.

The added amount of these dispersing agents is preferably 0.01 part or more by weight and 2.0 or less parts by weight for 100 parts by weight of the cerium oxide particles from the viewpoint of the dispersibility and precipitation-prevention of the particles in the polishing slurry and the relationship between polish scratches and the added amount of the dispersing agents. The molecular weight of the dispersing agents is preferably from 100 to 50,000, more preferably from 1,000 to 10,000. If the molecular weight of the dispersing agents is less than 100, a sufficient polishing rate cannot be obtained when a silicon oxide film or silicon nitride film is polished. If the molecular weight of the dispersing agents is more than 50,000, the viscosity becomes high so that the storage stability of the CMP polishing slurry becomes low.

As a method for dispersing these cerium oxide particles into water, there can be used a homogenizer, an ultrasonic disperser, a wet ball mill or the like besides dispersing treatment with an ordinary stirring machine.

The average particle size of the cerium oxide particles in the thus produced CMP polishing slurry is preferably from 0.01 to 1.0 μm. If the average particle size of the cerium oxide particles is less than 0.01 μm, the polishing rate becomes too low. If the size is more than 1.0 μm, a film to be polished is easily scratched.

About the average particle size of the cerium oxide particles in the invention, the slurry is diluted into an appropriate concentration if necessary, the particle sizes of the resultant are measured with a laser diffraction type particle size distribution meter, and the central value of the particle sizes is adopted.

The water-soluble polymer in the invention is not limited to any especial kind if the polymer is a compound having a skeleton of any one of an N-mono-substituted product and an N,N-di-substituted product of any one selected from the group consisting of acrylamide, methacrylamide and α-substituted products thereof.

The water-soluble polymer is preferably a compound which is yielded by radical polymerization or the like and has a weight-average molecular weight of 500 or more.

The water-soluble polymer is preferably a polymer containing a recurring unit made of at least one polymerizable monomer selected from the group of monomers represented by the following general formula (I) and the general formula (II):

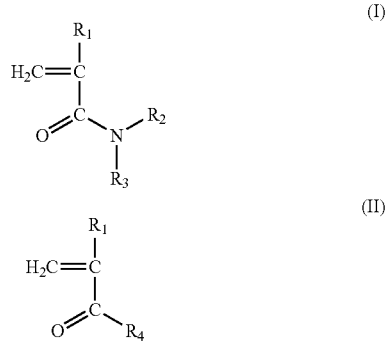

A copolymer using both of the monomers represented by the general formulas (I) and (II) can also be used.

In the general formula (I), $R_1$ represents a hydrogen atom, a methyl group, a phenyl group, a benzyl group, a chloro group, a difluoromethyl group, a trifluoromethyl group, or a cyano group; and $R_2$ and $R_3$ each independently represent a hydrogen atom, an alkyl chain of $C_1$ to $C_{18}$, a methylol group, or an acetyl group provided that the case that both of $R_2$ and $R_3$ are hydrogen is excluded.

In the general formula (II), $R_1$ is identical with $R_1$ in the formula (I), that is, $R_1$ represents a hydrogen atom, a methyl group, a phenyl group, a benzyl group, a chloro group, a difluoromethyl group, a trifluoromethyl group, or a cyano group. $R_4$ represents a morpholino group, a thiomorpholino group, a pyrrolidino group, or a piperidino group.

Examples of a monomer other than the general formulas (I) and (II) include radical-polymerizable monomers such as acrylic acid, acrylic acid esters of $C_1$ to $C_{18}$, methacrylic acid, methacrylic acid esters of $C_1$ to $C_{18}$, acrylamide, vinyl alcohol, acrylonitrile, vinylpyrrolidone, vinylpyridine, vinyl acetate, maleic acid, fumaric acid, itaconic acid, and p-styrene carboxylic acid.

Examples of the compound having a skeleton of any one of an N-mono-substituted product and an N,N-di-substituted product of any one selected from the group consisting of acrylamide, methacrylamide and α-substituted products thereof include compounds having an N-mono-substituted product skeleton, such as N-methylacrylamide, N-ethylacrylamide, N-propylacrylamide, N-isopropylacrylamide, N-butylacrylamide, N-isobutylacrylamide, N-t-butylacrylamide, N-heptylacrylamide, N-octylacrylamide, N-t-octylacrylamide, N-dodecylacrylamide, N-octadecylacrylamide, N-methylolacrylamide, N-acetylacrylamide, N-diacetoneacrylamide, N-methylmethacrylamide, N-ethylmethacrylamide, N-propylmethacrylamide, N-isopropylmethacrylamide, N-butylmethacrylamide, N-isobutylmethacrylamide, N-t-butylmethacrylamide, N-heptylmethacrylamide, N-octylmethacrylamide, N-t-octylmethacrylamide, N-dodecylmethacrylamide, N-octadecylmethacrylamide, N-methylolmethacrylamide, N-acetylmethacrylamide, and N-diacetonemethacrylamide; and compounds having an N,N-di-substituted product skeleton such as N,N-dimethylacrylamide, N,N-diethylacrylamide, N,N-dipropylacrylamide, N,N-diisopropylacrylamide, N,N-dibutylacrylamide, N,N-diisobutylacrylamide, N,N-di-t-butylacrylamide, N,N-diheptylacrylamide, N,N-dioctylacrylamide, N,N-di-t-octylacrylamide, N,N-didodecylacrylamide, N,N-dioctadecylacrylamide, N,N-dimethylolacrylamide, N,N-diacetylacrylamide, N,N-didiacetoneacrylamide, N,N-dimethylmethacrylamide, N,N-diethylmethacrylamide, N,N-dipropylmethacrylamide, N,N-diisopropylmethacrylamide, N,N-dibutylmethacrylamide, N,N-diisobutylmethacrylamide, N,N-di-t-butylmethacrylamide, N,N-diheptylmethacrylamide, N,N-dioctylmethacrylamide, N,N-di-t-octylmethacrylamide, N,N-didodecylmethacrylamide, N,N-dioctadecylmethacrylamide, N,N-dimethylolmethacrylamide, N,N-diacetylmethacrylamide, N,N-didiacetonemethacrylamide, acryloylpiperidine, acryloylmorpholine, acryloylthiomorpholine, and acryloylpyrrolidine. These may be used alone or in combination of two or more thereof.

The added amount of the water-soluble polymer is preferably in the range of 0.01 part or more by weight and 10 parts or less by weight for 100 parts by weight of the polishing slurry. If this added amount is too small, highly-flattening property may be not obtained. If the amount is too large, the polishing slurry may gelatinize so that the fluidity thereof may lower.

A different water-soluble polymer may also be used in the polishing slurry of the invention in order to control liquid properties thereof, such as the viscosity, pH and surface tension thereof. The water-soluble polymer is not limited to any especial kind, and examples thereof include alginic acid, pectic acid, carboxymethylcellulose, polymethacrylic acid, poly(ammonium methacrylate), polymaleic acid, polyitaconic acid, polyfumaric acid, poly(p-styrenecarboxylic acid), polyacrylic acid, polyacrylamide, poly(ammonium acrylate), poly(amide acid), and an ammonium salt of poly(amide acid); vinyl polymers such as polyvinyl alcohol and polyvinyl pyrrolidone; and nonionic surfactants. The weight-average molecular weight of the water-soluble polymer is preferably 500 or more.

Besides the above-mentioned materials, additives which are ordinarily added to a polishing slurry, such as colorants such as dye and pigment, and a pH adjustor, may be incorporated into the polishing slurry of the present invention as long as the effects and advantages of the polishing slurry are not damaged.

The pH in the invention is preferably from 6 to 9 from the viewpoint of the flattening performance thereof. The pH can be adjusted with an acid, or an alkali component such as ammonia, tetramethylammonium hydroxide.

The polishing slurry of the invention gives a stable property whether the polishing slurry is stored as a two-liquid type CMP polishing slurry wherein a cerium oxide slurry comprising the cerium oxide particles, the dispersing agent and water, and an additive solution comprising the additives containing the water-soluble polymer and water are separated, or as a one-liquid type polishing slurry containing the additives beforehand.

In the case that the polishing slurry is stored as the two-liquid type polishing slurry, wherein the cerium oxide slurry and the additive solution are separated, the flattening property and the polishing rate can be adjusted by changing the proportion between these two liquids at will. In the case of the two-liquid type, the following method is adopted: a method of sending the additive solution and the cerium oxide slurry through separate pipes, jointing these pipes to mix them immediately before an exit in a supplying pipe, and supplying the mixture to a polishing table, or a method of mixing the additive slurry with the cerium oxide slurry immediately before polishing.

Examples of the method for producing an inorganic insulator film to which the CMP polishing slurry of the present invention is applied include low-pressure CVD and plasma CVD methods. In order to form an silicon oxide film by the low-pressure CVD method, monosilane: $SiH_4$ is used a Si source, and oxygen: $O_2$ is used as an oxygen source. The film is obtained by conducting this $SiH_4$—$O_2$ based oxidization reaction at a low temperature of 400° C. or lower. As the case may be, the film is thermally treated at a temperature of 1000° C. or lower after the CVD. When the film is doped with phosphorus: P to flatten the surface by high-temperature reflow, it is preferred to use $SiH_4$—$O_2$—$PH_3$ based reaction gas.

Plasma CVD has an advantage that chemical reaction for which high temperature is necessary under ordinary thermal equilibrium can be attained at low temperature. As the method for generating plasma, two types of capacitive coupling and inductive coupling types can be given. Reactive gas therefor may be $SiH_4$—$N_2O$ based gas using $SiH_4$ as a Si source and using $N_2O$ as an oxygen source, or TEOS-$O_2$ based gas using tetraethoxysilane (TEOS) as a Si source (TEOS-plasma CVD). The substrate temperature is preferably from 250 to 400° C. and the reaction pressure is preferably from 67 to 400 Pa. The silicon oxide film to which the polishing slurry of the invention is applied in this way may be doped with phosphorus, boron or some other element. Similarly, in order to form a silicon nitride film by low-pressure CVD, dichlorosilane: $SiH_2Cl_2$ is used as a Si source and ammonia: $NH_3$ is used as a nitrogen source. The film is obtained by conducting this $SiH_2Cl_2$—$NH_3$ based oxidization reaction at a high temperature of 900° C. In plasma CVD, reaction gas therefor may be $SiH_4$—$NH_3$ based gas using $SiH_4$ as a Si source and using $NH_3$ as a nitrogen source. The substrate temperature is preferably from 300 to 400° C.

The polishing method of the present invention is characterized by polishing a film to be polished on a substrate with the CMP polishing slurry of the present invention. As the substrate, there can be used, for example, a substrate associated with the production of a semiconductor, that is, a substrate wherein an inorganic insulator film is formed on a semiconductor substrate, such as a semiconductor substrate at the stage when circuit elements and a wiring pattern are formed, or a semiconductor substrate at the stage when circuit elements are formed. The film to be polished may be the above-mentioned inorganic insulator layer, for example, a silicon oxide film layer, or a silicon nitride film layer and a silicon oxide film layer.

According to the polishing method of the present invention, a substrate on which a film to be polished is formed is pushed against a polishing cloth of a polishing table, pressure is applied to the substrate, and then the film to be polished on the substrate and the polishing cloth are relatively moved while the CMP polishing slurry of the present invention is supplied between the film and the polishing cloth. Specifically, it is advisable to move at least one of a substrate on a polishing device and a polishing table thereof. The substrate on which the film to be polished may be a semiconductor substrate on which at least a silicon oxide film layer is formed as described above. The following will describe the polishing method of the invention about a case of a semiconductor substrate on which an inorganic insulator layer is formed.

A silicon oxide film layer or silicon nitride film layer formed on a semiconductor substrate is polished with the above-mentioned CMP polishing slurry, thereby removing irregularities in the surface of the silicon oxide film layer so that the surface can be rendered a flat and smooth face over the entire surface of the semiconductor substrate. The method can be used for shallow trench isolation also. In order to use the method for shallow trench isolation, it is preferred that the ratio of the rate of polishing a silicon oxide film to that of polishing a silicon nitride film, that is, the silicon oxide film polish rate/the silicon nitride film polish rate is 10 or more. If this ratio is less than 10, the difference between the silicon oxide film polish rate and the silicon nitride film polish rate is small. Thus, at the time of performing shallow trench isolation, the polishing tends to be unable to be stopped at a given position. When this ratio is 10 or more, the silicon nitride film polish rate becomes smaller so that the polishing is easily stopped. Thus, this case is more preferable for shallow trench isolation. In order to use the present method for shallow trench isolation, it is preferred that scratches are less generated at the time of the polishing.

As a polishing device therefor, there is used an ordinary polishing device having a holder for holding a semiconductor substrate, and a polishing table to which a polishing cloth (pad) is attached and to which a motor the rotation number of which can be changed and other members are fitted. The polishing cloth on the polishing table is not limited to any especial kind, and the following can be used therefor: ordinary nonwoven fabric, foamed polyurethane, porous fluorine-contained resin, or the like. It is preferred to subject the polishing cloth to grooving working in order for the CMP polishing slurry to be collected. Conditions for the polishing are not limited. The rotation number of the table is preferably as low as 200 rpm or less in order for the semiconductor substrate not to fly out therefrom, and the pressure applied to the semiconductor substrate is preferably about 98 kPa (1 kg/cm$^2$) or less not to generate scratches therein after the polishing. During the polishing, the polishing slurry of the present invention is continuously supplied to the polishing cloth with a pump or the like. The supply amount of the polishing slurry is not limited, and is preferably such an amount that the surface of the polishing cloth is constantly coated with the polishing slurry.

It is preferred that the semiconductor substrate after the end of the polishing is sufficiently washed with flowing water and subsequently water droplets attaching on the semiconductor substrate are swept off with a spin drier or the like so as to dry the substrate. After a flattened shallow trench is made in this way, aluminum wires are formed on the silicone oxide insulator film layer and further a silicon oxide insulator film is again formed between the wires and on the wires by the above-mentioned method. Thereafter, the above-mentioned CMP polishing slurry is used to polish the resultant in the same manner, thereby removing irregularities in the surface of the insulator film to render the surface a flat and smooth face over the entire surface of the semiconductor substrate. This step is repeated given times, thereby producing a desired number of layers.

In order to globally flatten a film to be polished (silicon oxide film) having irregularities, it is necessary to polish convex regions thereof selectively. When the CMP polishing slurry of the invention, which contains a water-soluble polymer, is used, the water-soluble polymer acts as a buffer agent between cerium oxide particles therein and the film to be polished. In other words, concave regions of the film having a small effective polish load are protected but convex regions of the film having a large effective polish load are selectively polished through exclusion of the water-soluble polymer so that the film can be globally polished without depending the pattern thereof largely.

The CMP polishing slurry and the polishing method of the invention make it possible to polish not only a silicon oxide film formed on a semiconductor substrate but also the following: an silicon oxide film formed on a wiring board having given wires; inorganic insulator films made of glass, silicon nitride or the like; films which mainly comprise polysilicon, Al, Cu, Ti, TiN, W, Ta, TaN or the like; optical glasses such as a photo-mask, a lens and a prism; inorganic electroconductive films made of ITO or the like; optical integrated circuits, optical switching elements and optical waveguides, which are made of glass and crystalline material; optical monocrystals such as end faces of optical fibers and scintillators; solid laser monocrystals; sapphire substrates for blue laser LEDs; semiconductor monocrystals made of SiC, GaP, GaAs or the like; glass substrates for magnetic discs; magnetic heads; and others.

EXAMPLES

The following will describe the present invention by way of working examples and comparative examples. However, the present invention is not limited to these working examples. The word "part(s)" in synthesis examples indicates part(s) by weight.

Preparation Example of Cerium Oxide Particles

Into a container made of platinum was put 2 kg of cerium carbonate hydrate, and the compound was fired at 800° C. in the air for 2 hours, thereby yielding about 1 kg of yellowish white powder. The phase of this powder was identified by an X-ray diffraction method. As a result, it was verified that the material thereof was cerium oxide. The particle size of the fired powder was from 30 to 100 μm. The surface of the fired powder particles was observed with a scanning electron microscope. As a result, grain boundaries of cerium oxide were observed. The diameter of primary particles of cerium oxide surrounded by the grain boundaries was measured. As a result, the value at the center of the volume distribution thereof was 190 nm, and the maximum value was 500 nm.

A jet mill was used to dry-pulverize 1 kg of the cerium oxide powder. The pulverized particles were observed with the scanning electron microscope. As a result, small particles having sizes equivalent to the primary particle sizes were observed and further large particles not pulverized, 1 to 3 μm in size, and particles not pulverized, 0.5 to 1 μm in size, were mixed.

[Synthesis of Water-Soluble Polymer]

Synthesis Example 1

Into a 2-L flask were charged 400 parts of deionized water, and the temperature of the water was raised to 90° C. while the water was stirred in the atmosphere of nitrogen gas. Thereafter, a substance wherein 1 part of a polymerization initiator (trade name: "V-085", manufactured by Wako Pure Chemical Industries, Ltd.) was dissolved in 100 parts of N,N-dimethylacrylamide was poured into the flask over 1 hour. Thereafter, the temperature of the solution was kept at 90° C. for 5 hours, and then the solution was cooled to room temperature. The resultant was taken out, so that a water-soluble polymer solution was obtained.

Synthesis Example 2

Under the same conditions as in Synthesis Example 1, 95 parts of acryloylmorpholine and 5 parts of acrylic acid were polymerized. The resultant was cooled to room temperature, and adjusted into a pH of 7.8 with ammonia water. In this way, a water-soluble polymer solution was obtained.

Synthesis Example 3

Under the same conditions as in Synthesis Example 1, 95 parts of N-isopropylacrylamide and 5 parts of acrylic acid were polymerized. The resultant was cooled to room temperature, and adjusted into a pH of 7.5 with ammonia water. In this way, a water-soluble polymer solution was obtained.

[Production of Polishing Slurry]

Example 1

Polishing Slurry Example 1

One kilogram of the cerium oxide particles prepared as described above, 23 g of a (40% by weight) solution of an ammonium salt of polyacrylic acid in water, and 8977 g of deionized water were mixed. While the solution was stirred, the solution was subjected to ultrasonic dispersion for 10 minutes. The resultant slurry was filtrated with a 1-μm filter, and further deionized water was added thereto so as to yield a 5% by weight cerium oxide slurry.

The pH of the slurry was 8.3. In order to measure the slurry particles with a laser diffraction type particle size distribution meter, the slurry was diluted into an appropriate concentration. The measurement was then made. As a result, the central value of the particle sizes was 190 nm.

Six hundred grams of the above-mentioned cerium oxide slurry (solid content: 5% by weight), 30 g of the water-soluble polymer solution obtained in Synthesis Example 1, and 2370 g of deionized water were mixed to produce a cerium oxide polishing slurry (solid content: 1% by weight) containing the water-soluble polymer. The pH of the polishing slurry was 8.1. In order to measure the slurry particles with the laser diffraction type particle size distribution meter, the slurry was diluted into appropriate concentrations. The measurement was then made. As a result, the central values of the particle sizes were each 190 nm.

Example 2

Polishing Slurry Example 2

Preparation and evaluation were performed in the same way as in Polishing Slurry Example 1 except that the solution of Synthesis Example 2 was used as the water-soluble polymer solution. The pH of the polishing slurry was 7.8. In order to measure the slurry particles with the laser diffraction type particle size distribution meter, the slurry was diluted into appropriate concentrations. The measurement was then made. As a result, the central values of the particle sizes were each 190 nm.

Example 3

Polishing Slurry Example 3

Preparation and evaluation were performed in the same way as in Polishing Slurry Examples 1 and 2 except that the solution of Synthesis Example 3 was used as the water-soluble polymer solution. The pH of the polishing slurry was 7.5. In order to measure the slurry particles with the laser diffraction type particle size distribution meter, the slurry was diluted into appropriate concentrations. The measurement was then made. As a result, the central values of the particle sizes were each 190 nm.

[Polishing of Insulator Film]

Example 1

Polishing Example 1

An Al wire line region having a line/space width of 0.05 to 5 mm and a height of 1000 nm was formed on a Si substrate of 200 mm in diameter, and then a silicon oxide film having a thickness of 2000 nm was formed thereon by TEOS-plasma CVD, so as to produce a pattern wafer.

The pattern wafer produced as described above, which may be referred to as the wafer hereinafter, was set onto a holder of a polishing device, an adsorbing pad onto which a substrate to be held would be fitted being attached to the holder. The holder was put onto a polishing table, 600 mm in diameter, which a polishing pad (polishing cloth) made of a porous urethane resin was attached to, so as to direct the insulator film (silicon oxide film) face of the wafer downwards. Furthermore, the working load thereon was set to 29.4 kPa (300 gf/cm$^2$).

While the cerium oxide polishing slurry (solid content: 1% by weight) of Polishing Slurry Example 1 was dropped out on the polishing table at a rate of 200 cc/min, the polishing table and the wafer were rotated at 50 rpm for 2 minutes to polish the insulator film of the pattern wafer. The wafer after the polishing was sufficiently washed with pure water, and then dried. The time for the polishing was changed into 3, 4, 5 and 6 minute to polish the above-mentioned pattern wafer in the same way.

A light interference type film thickness measuring device was used to measure the difference in the film thickness before and after the polishing, and then any polish rate was calculated. The polish rate ratio of $R_5/R_1$ and that of $R_3/R_1$, wherein $R_1$ is the polish rate of a line region having a line/space width of 1 mm, $R_3$ is the polish rate of a line region having a line/space width of 3 mm, and $R_5$ is the polish rate of a line region having a line/space width of 5 mm, became larger with the passage of the polishing time in the period when the polishing time was from 2 to 4 minutes, and were substantially constant in the period when the polishing time was from 4 to 6 minutes.

In the case of the polishing time of 4 minutes, wherein the pattern-width dependency of the polish rate became constant, the polish rate $R_1$ of the line region having the line/space width of 1 mm was 344 nm/minute (polish amount: 1376 nm), the polish rate $R_3$ of the line region having the line/space width of 3 mm was 335 nm/minute (polish amount: 1340 nm), the polish rate $R_5$ of the line region having the line/space width of 5 mm was 315 nm/minute (polish amount: 1260 nm), and the polish rate ratio of $R_5/R_1$ and that of $R_3/R_1$ were 0.92 and 0.97, respectively. The polish amount of the line region of each of the line/space widths in the case that the polishing time was 5 minutes and 6 minutes was substantially equal to that in the case that the polishing time was 4 minutes. It was found out that the polishing hardly advanced after the 4 minutes.

Example 2

Polishing Example 2

A pattern wafer was polished in the same way as in Polishing Example 1 except that the cerium oxide polishing slurry of Polishing Slurry Example 2 was used. In the same way as in Polishing Example 1, the light interference type film thickness measuring device was used to measure the difference in the film thickness before and after the polishing, and then any polish rate was calculated. The polish rate ratio of $R_5/R_1$ and that of $R_3/R_1$, wherein $R_1$ is the polish rate of a line region having a line/space width of 1 mm, $R_3$ is the polish rate of a line region having a line/space width of 3 mm, and $R_5$ is the polish rate of a line region having a line/space width of 5 mm, became larger with the passage of the polishing time in the period when the polishing time was from 2 to 4 minutes, and were substantially constant in the period when the polishing time was from 4 to 6 minutes.

In the case of the polishing time of 4 minutes, wherein the pattern-width dependency of the polish rate became constant, the polish rate $R_1$ of the line region having the line/space width of 1 mm was 343 nm/minute (polish amount: 1372 nm), the polish rate $R_3$ of the line region having the line/space width of 3 mm was 335 nm/minute (polish amount: 1338 nm), the polish rate $R_5$ of the line region having the line/space width of 5 mm was 313 nm/minute (polish amount: 1252 nm), and the polish rate ratio of $R_5/R_1$ and that of $R_3/R_1$ were 0.91 and 0.98, respectively. The polish amount of the line region of each of the line/space widths in the case that the polishing time was 5 minutes and 6 minutes was substantially equal to that in the case that the polishing time was 4 minutes. It was found out that the polishing hardly advanced after the 4 minutes.

Example 3

Polishing Example 3

A pattern wafer was polished in the same way as in Polishing Examples 1 and 2 except that the cerium oxide polishing slurry of Polishing Slurry Example 3 was used. In the same way as in Polishing Examples 1 and 2, the light interference type film thickness measuring device was used to measure the difference in the film thickness before and after the polishing, and then any polish rate was calculated. The polish rate ratio of $R_5/R_1$ and that of $R_3/R_1$, wherein $R_1$ is the polish rate of a line region having a line/space width of 1 mm, $R_3$ is the polish rate of a line region having a line/space width of 3 mm, and $R_5$ is the polish rate of a line region having a line/space width of 5 mm, became larger with the passage of the polishing time in the period when the polishing time was from 2 to 4 minutes, and were substantially constant in the period when the polishing time was from 4 to 6 minutes.

In the case of the polishing time of 4 minutes, wherein the pattern-width dependency of the polish rate became constant, the polish rate $R_1$ of the line region having the line/space width of 1 mm was 346 nm/minute (polish amount: 1384 nm), the polish rate $R_3$ of the line region having the line/space width of 3 mm was 337 nm/minute (polish amount: 1348 nm), the polish rate $R_5$ of the line region having the line/space width of 5 mm was 317 nm/minute (polish amount: 1268 nm), and the polish rate ratio of $R_5/R_1$ and that of $R_3/R_1$ were 0.92 and 0.97, respectively. The polish amount of the line region of each of the line/space widths in the case of the polishing times of 5 minutes and 6 minutes, was substantially equal to that in the case that the polishing time was 4 minutes. It was found out that the polishing hardly advanced after the 4 minutes.

Comparative Example 1

Production of Cerium Oxide Polishing Slurry

A 5% by weight cerium oxide slurry was obtained in the same way as in Example 1. The pH of the slurry was 8.3. Six hundred grams of this cerium oxide slurry (solid content: 5% by weight) was mixed with 2400 g of deionized water to produce a cerium oxide polishing slurry A (solid content: 1% by weight). The pH of the polishing slurry was 7.4. In order to measure the particles in the polishing slurry with the laser diffraction type particle size distribution meter, the polishing slurry was diluted into an appropriate concentration, and then the measurement was made. As a result, the central value of the particle sizes was 190 nm.

[Polishing of Insulator Film]

An insulator film on a pattern wafer was polished in the same way as in Polishing Examples 1 to 3 except that the cerium oxide polishing slurry A produced as described above was used as the polishing slurry and further the table and the wafer were rotated at 50 rpm for 1 minute. The wafer after the polishing was sufficiently washed with pure water, and then dried.

In the same way, the pattern wafer was polished under conditions that the polishing time was changed to 1.5 minute and 2 minutes.

In the same way as in Polishing Examples 1 to 3 in Examples, the light interference type film thickness measuring device was used to measure the difference in the film thickness before and after the polishing, and then any polish rate was calculated.

The polish rate ratio of $R_5/R_1$ and that of $R_3/R_1$, wherein $R_1$ is the polish rate of a line region having a line/space width of 1 mm, $R_3$ is the polish rate of a line region having a line/space width of 3 mm, and $R_5$ is the polish rate of a line region having a line/space width of 5 mm, were substantially constant in the period when the polishing time was from 1 to 2 minutes. In the case of the polishing time of 1.5 minutes, wherein the pattern-width dependency of the polish rate became constant in accordance with the polishing time, the polish rate $R_1$ of the line region having the line/space width of 1 mm was 811 nm/minute (polish amount: 1216 nm), the polish rate $R_3$ of the line region having the line/space width of 3 mm was 616 nm/minute (polish amount: 924 nm), the polish rate $R_5$ of the line region having the line/space width of 5 mm was 497 nm/minute (polish amount: 746 nm), and the polish rate ratio of $R_5/R_1$ and that of $R_3/R_1$ were 0.61 and 0.76, respectively. In the case of the polishing time of 2 minutes, at line regions having line/space widths ranging from 0.05 to 1 mm, the Al wires underlying the silicon oxide film were also polished.

INDUSTRIAL APPLICABILITY

According to the present invention, it is possible to provide a polishing slurry and a polishing method which make it possible to polish a film made of silicon oxide or the like effectively and rapidly and further control the process therefor easily in CMP technique for flattening an interlayer insulating film, a BPSG film, an insulator film for shallow trench isolation, and other films.

What is claimed is:

1. A polishing method for polishing a film to be polished formed on a substrate using a CMP polishing slurry, wherein said film to be polished comprises silicon oxide film,
   wherein the polishing method comprises the following steps:
   a step to prepare a substrate on which said film comprising silicon oxide film is formed; and
   a step to polish said film wherein the substrate is pushed against a polishing cloth of a polishing table and pressure is applied to the substrate while a CMP polishing slurry is supplied between said film and the polishing cloth,
   wherein said CMP polishing slurry comprises cerium oxide particles, a dispersing agent, a water-soluble polymer and water, wherein the added amount of the water-soluble polymer is 0.01 part or more by weight and 10 parts or less by weight for 100 parts by weight of the polishing slurry and wherein the water soluble polymer is a polymer containing a structural unit made of at least one polymerizable monomer selected from the group consisting of the following general formula (I):

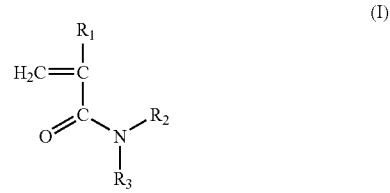

wherein $R_1$ represents hydrogen, a methyl group, a phenyl group, a benzyl group, a chloro group, a difluoromethyl group, a trifluoromethyl group, or a cyano group; and $R_2$ and $R_3$ each independently represent hydrogen, an alkyl chain of $C_1$ to $C_{18}$, a methylol group, or an acetyl group provided that the case that both of $R_2$ and $R_3$ are hydrogen is excluded.

2. The polishing method according to claim 1, wherein the dispersing agent is at least one selected from a polymeric dispersing agent containing an ammonium salt of acrylic acid as polymerizable monomer component, water-soluble anionic dispersing agents, water-soluble nonionic dispersing agents, water-soluble cationic dispersing agents, and water-soluble amphoteric dispersing agents.

3. The polishing method according to claim 1, wherein the dispersing agent contains at least one polymeric dispersing agent containing an ammonium salt of acrylic acid as a polymerizable monomer component.

4. The polishing method according to claim 1, wherein the amount of the dispersing agents is 0.01 part or more by weight and 2.0 or less parts by weight for 100 parts by weight of the cerium oxide particles.

5. A polishing method for polishing a film to be polished formed on a substrate using a CMP polishing slurry, wherein said film to be polished comprises silicon oxide film,
   wherein the polishing method comprises the following steps:
   a step to polish prepare a substrate on which said film comprising silicon oxide film is formed; and
   a step to polish said film wherein the substrate is pushed against a polishing cloth of a polishing table and pressure is applied to the substrate while a CMP polishing slurry is supplied between said film and the polishing cloth,
   wherein said CMP polishing slurry comprises cerium oxide particles, a dispersing agent, a water-soluble polymer and water,
   wherein the added amount of the water-soluble polymer is 0.01 part or more by weight and 10 parts or less by weight for 100 parts by weight of the polishing slurry,
   wherein the concentration of the cerium oxide particles in the CMP polishing slurry is within the range of 0.5% by weight or more to 20% by weight or less, and
   wherein the water soluble polymer is a polymer containing a structural unit made of at least one polymerizable monomer selected from the group consisting of the following general formula (I):

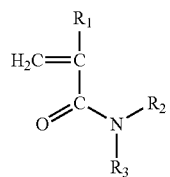 (I)

wherein $R_1$ represents hydrogen, a methyl group, a phenyl group, a benzyl group, a chloro group, a difluoromethyl group, a trifluoromethyl group, or a cyano group; and $R_2$ and $R_3$ each independently represent hydrogen, an alkyl chain of $C_1$ to $C_{18}$, a methylol group, or an acetyl group provided that the case that both of $R_2$ and $R_3$ are hydrogen is excluded.

6. The polishing method according to claim 5, wherein the dispersing agent is at least one selected from a polymeric dispersing agent containing an ammonium salt of acrylic acid as a polymerizable monomer component, water-soluble anionic dispersing agents, water-soluble nonionic dispersing agents, water-soluble cationic dispersing agents, and water-soluble amphoteric dispersing agents.

7. The polishing method according to claim 5, wherein the dispersing agent contains at least one polymeric dispersing agent containing an ammonium salt of acrylic acid as a polymerizable monomer component.

8. The polishing method according to claim 5, wherein the amount of the dispersing agents is 0.01 part or more by weight and 2.0 or less parts by weight for 100 parts by weight of the cerium oxide particles.

* * * * *